United States Patent [19]

Taniguchi et al.

[11] Patent Number: 5,346,513
[45] Date of Patent: Sep. 13, 1994

[54] METHOD FOR PRODUCING SEMICONDUCTOR DEVICE USING A VACUUM SEALING MECHANISM HAVING INNER AND OUTER BELLOWS

[75] Inventors: Takao Taniguchi; Hiroshi Satou, both of Fukuoka, Japan

[73] Assignee: Mitsubishi Denki Kabushiki Kaisha, Tokyo, Japan

[21] Appl. No.: 65,756

[22] Filed: May 24, 1993

Related U.S. Application Data

[62] Division of Ser. No. 854,875, Mar. 23, 1992, Pat. No. 5,266,119.

[30] Foreign Application Priority Data

May 13, 1991 [JP] Japan .................. 3-138490

[51] Int. Cl.$^5$ ............... C23C 16/00; H01L 21/306; H01L 21/68
[52] U.S. Cl. ................. 29/25.01; 118/730; 118/733
[58] Field of Search ........... 156/DIG. 93; 29/25.01; 118/730, 733

[56] References Cited

U.S. PATENT DOCUMENTS

| | | | |
|---|---|---|---|
| 4,045,181 | 10/1977 | Burd et al. | 23/273 R |
| 4,213,051 | 7/1980 | Struthoff et al. | 250/457 |
| 4,360,499 | 11/1982 | Gubitose et al. | 422/246 |
| 5,100,502 | 3/1992 | Murdoch et al. | 156/643 |

FOREIGN PATENT DOCUMENTS 61-83445 6/1986 Japan.

*Primary Examiner*—Olik Chaudhuri
*Assistant Examiner*—David E. Graybill
*Attorney, Agent, or Firm*—Leydig, Voit & Mayer

[57] ABSTRACT

A method for manufacturing a semiconductor device using an apparatus including a processing chamber having an opening and capable of being vacuum sealed, a carrier member including a substrate holder, an arm member, and a substrate carrier which vertically reciprocates in the opening of the processing chamber. A vacuum bellows is divided into an upper bellows and a lower bellows that are attached to a hollow flange therebetween. The upper bellows is a double structure having an inner bellows and an outer bellows. An air inlet is formed in the hollow flange and air is introduced through the inlet into a ring-shaped space between the inner bellows and the outer bellows.

8 Claims, 8 Drawing Sheets

FIG.8(b) PRIOR ART

METHOD FOR PRODUCING SEMICONDUCTOR DEVICE USING A VACUUM SEALING MECHANISM HAVING INNER AND OUTER BELLOWS

This application is a division of application Ser. No. 07/854,875, filed Mar. 23, 1992, now U.S. Pat. No. 5,266,119.

FIELD OF THE INVENTION

The present invention relates to a semiconductor device producing apparatus having a semiconductor substrate carrying means which carries a semiconductor substrate in vacuum by a reciprocating carrier member having a carrier shaft. Particularly, it relates to a sealing mechanism of the semiconductor device producing apparatus, which vacuum seals a space between the reciprocating carrier member and a processing chamber and, more particularly, to a sealing mechanism that can reduce or eliminate the thrust applied to the carrier member. The present invention also relates to a method for producing a semiconductor device using such a sealing mechanism.

PRIOR ART

Figure 4:
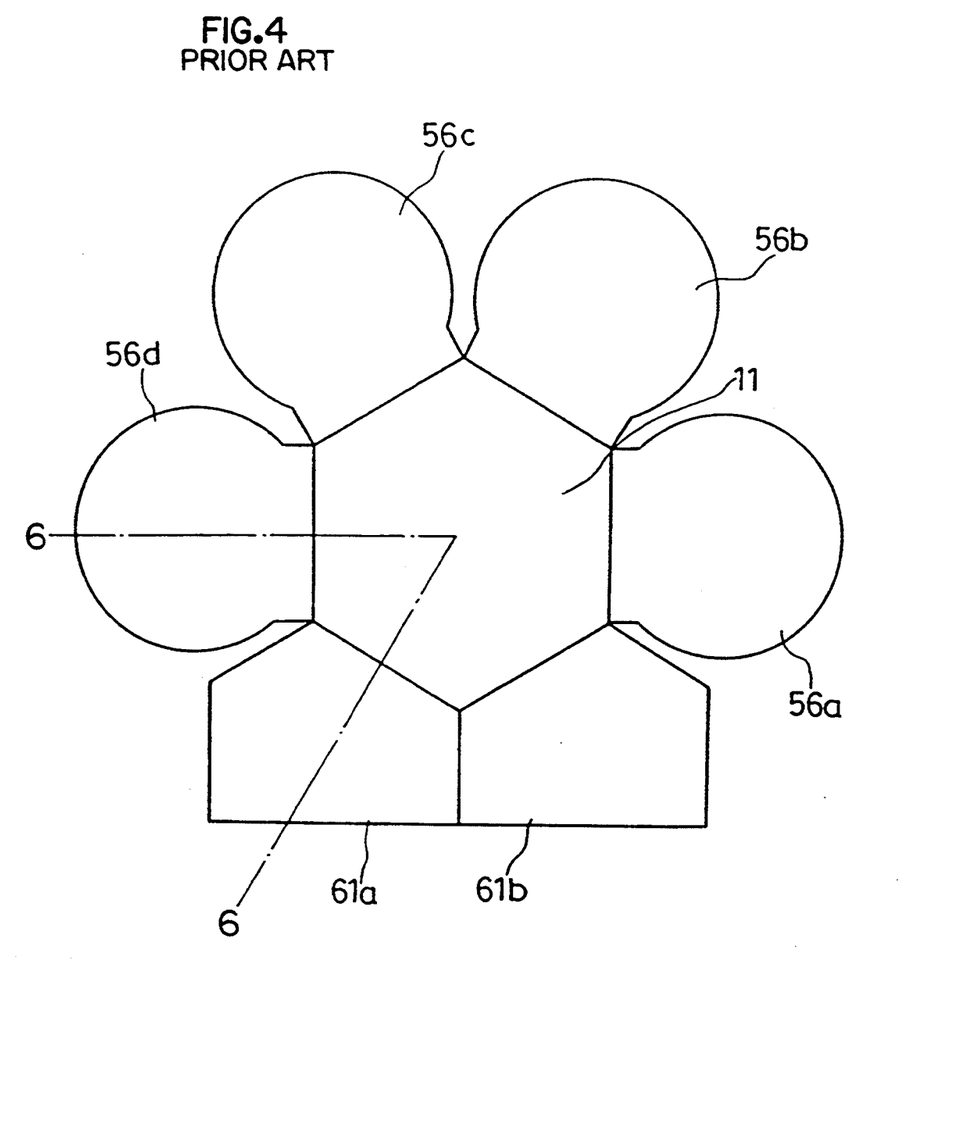
FIG. 4 is a plan view showing a semiconductor device producing apparatus in accordance with the prior art.

FIG. 4 is a plan view of a semiconductor device producing apparatus. In FIG. 4, a carrier chamber 11 having a hexagonal plan is surrounded by four reaction chambers 56a to 56d and two spare chambers 61a and 61b. The spare chamber 61a is a chamber for producing a low vacuum beginning from atmospheric pressure. The spare chamber 61b adjacent to the spare chamber 61a is a chamber for reaching atmospheric pressure from a low vacuum. The carrier chamber 11 is a chamber for carrying a semiconductor substrate from the spare chamber 61a to the respective reaction chambers 56a to 56d or from the respective reaction chambers 56a to 56d to the spare chamber 61a. A CVD apparatus is provided in each reaction chamber 56a to 56d and a thin film is formed on a semiconductor substrate in each the reaction chamber as the substrate is carried thereinto from the carrier chamber 11.

Figure 6:
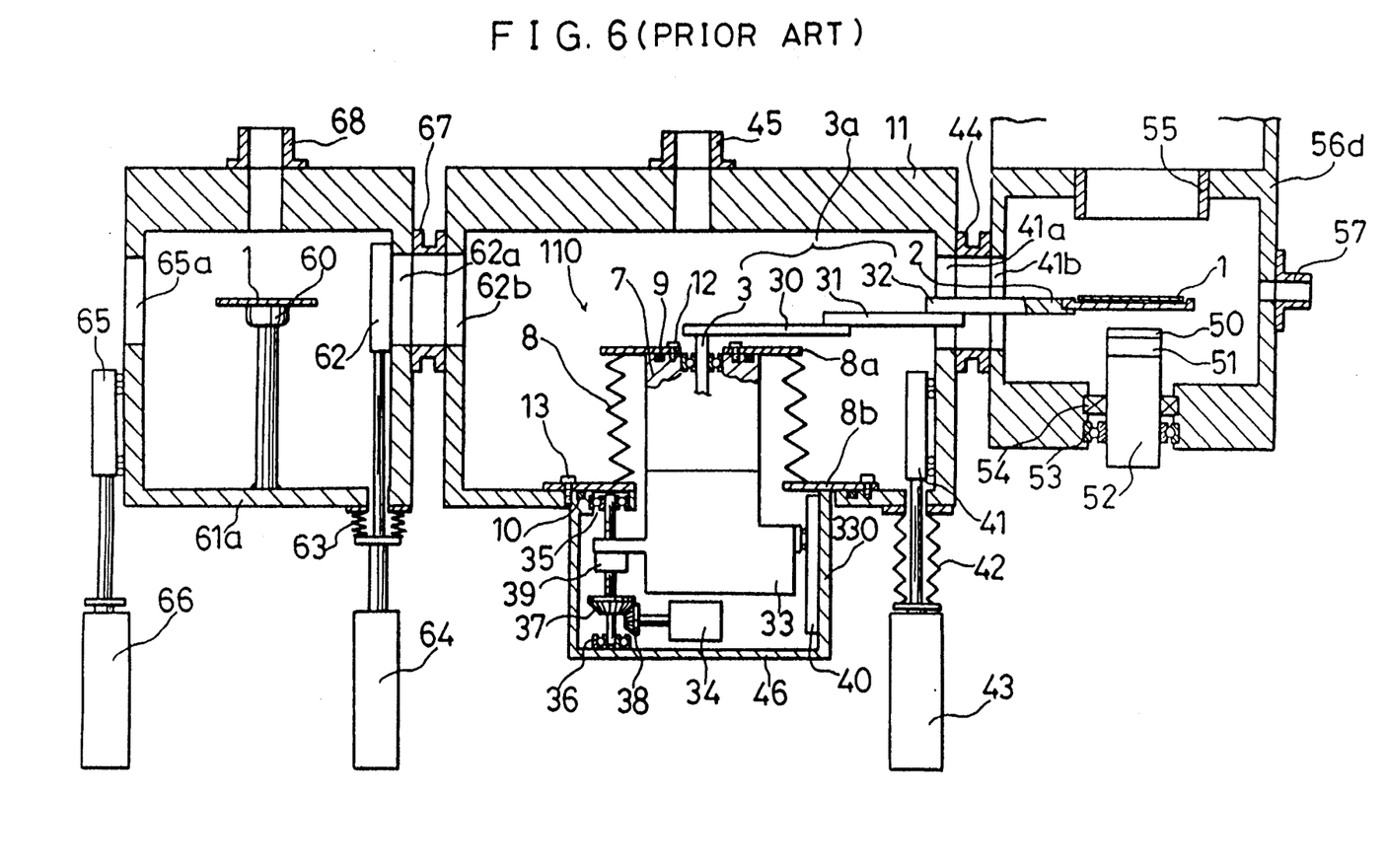
FIG. 6 is a cross-sectional view showing a structure of a semiconductor device producing apparatus in accordance with the prior art.

FIG. 6 is a cross-section taken along a line A—A of FIG. 4, showing sectional structures of the spare chamber 61a, the reaction chamber 56d and the carrier chamber In FIG. 6 the spare chamber 61a has a first gate 65a and a second gate 62a at the opposite sides thereof. The first and second gates 65a and 62a are opened and closed by the first and second gate shutters 65 and 62 which are vertically driven by the first and second air cylinders 66 and 64, respectively. The second air cylinder 64 is provided with a vacuum bellows 63 which contracts and expands while the second gate shutter 62 rises and falls thereby to vacuum seal the spare chamber 61a. A delivery stage 60 for delivering the semiconductor substrate 1 is provided on the center of the bottom of the spare chamber 61a. An exhaust port 68 for controlling the pressure in the chamber is provided at the center of the top of the spare chamber 61a. The second gate 62a communicates with the third gate 62h of the carrier chamber 11 via the gate connecting part 67.

The reaction chamber 56d has a fifth gate 41b which is opened and closed by the third gate shutter 41. The reaction chamber 56d has an opening at the center of the bottom thereof, and a holder 52 having a stage 50 and a heater 51 is provided at the opening. A reactive gas inlet 55 is provided at the top of the reaction chamber 56d. An exhaust port 57 for controlling the pressure in the reaction chamber 56d and for evacuating the chamber 56d is provided at the side of the chamber 56d. A bearing 53 rotatably the holder 52. A seal 54 is provided between the holder 52 and the opening of the reaction chamber 56d and seals the reaction chamber 56d during the rotation of the holder 52.

The carrier chamber 11 has an opening at the center of its bottom and a semiconductor substrate carrying means 110 is provided at the opening via a lower flange 8b. This semiconductor substrate carrying means 110 comprises a case 46 including a driving part 330 for vertically driving the carrier shaft 7, a vacuum bellows 8 for vacuum sealing a space between the carrier shaft 7 and the carrier chamber 11 while the shaft 7 vertically moves, and an arm member 3a for carrying the semiconductor substrate 1. The arm member 3a is constituted by a rotary shaft 3 and first to third arms 30 to 32. The lower flange 8b is fixed to the edge of the opening of the carrier chamber 11 by bolts 13 and O rings 10 thereby to seal up the carrier chamber 11. In addition, an exhaust port 45 for controlling the pressure in the carrier chamber 11 is provided at the top of the carrier chamber 11. In the driving part 330, the motor 34 is driven and its driving force is transmitted to the carrier shaft driving part 33 via the bevel gears 38 and 37 and then the ball screw 39. The carrier shaft driving part 33 vertically moves along the axis of the bevel gear 37 and the guide 40. Reference numerals 35 and 36 are bearings for the axis of the bevel gear 37° In addition, a third gate 62 and a fourth gate 41a which are opened and closed by the second gate shutter 62 and the third gate shutter 41, respectively are provided at the both sides of the carrier chamber 11. The third gate shutter 41 is vertically moved by the third air cylinder 43. The third air cylinder 43 is provided with a vacuum bellows 42 which contracts and expands while the third gate shutter 41 rises and falls thereby to vacuum seal the carrier chamber 11. The fourth gate 41a communicates with the fifth gate 41b of the reaction chamber 56d via the gate connection part 44.

Figure 5:
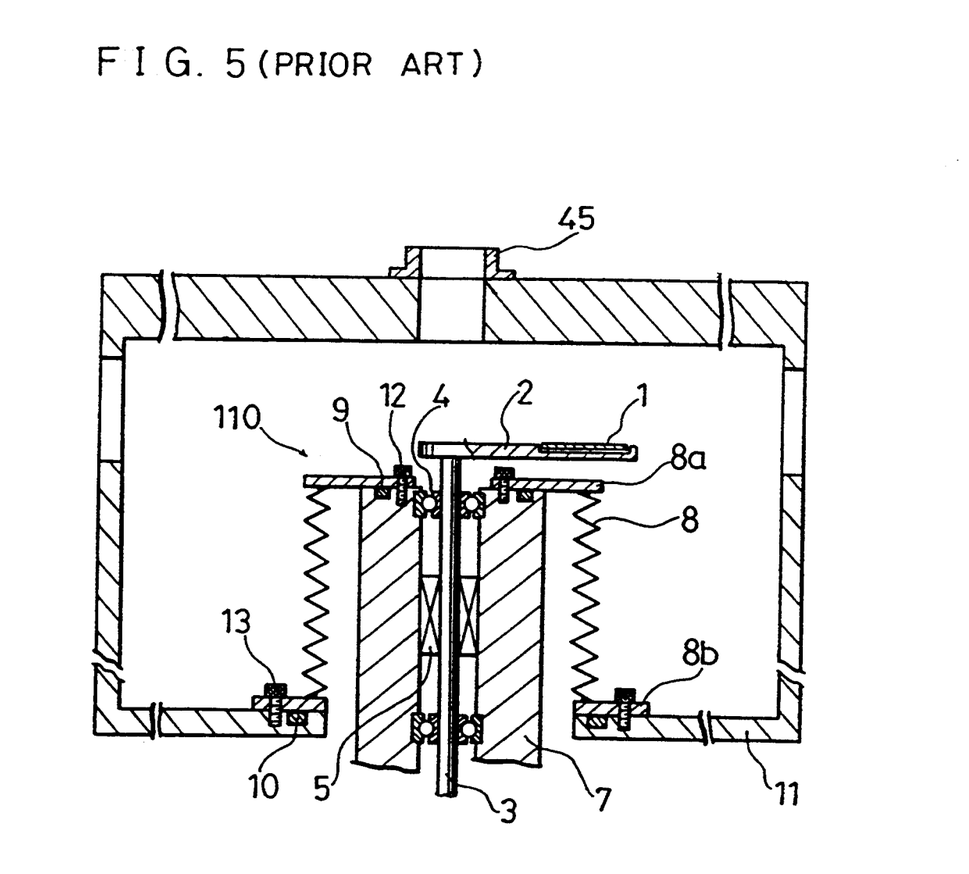
FIG. 5 is a cross-sectional view showing a structure of a carrier shaft of a semiconductor substrate carrying means in accordance with the prior art.

A structure of the carrier shaft part of the semiconductor substrate carrying device 110, which is omitted in FIG. 6, will be described hereinafter with reference to FIG. 5. In FIG. 5, the carrier shaft 7 is provided around the rotary shaft 3 of the arm member 3a via the bearing 4 and the seal 5 and a vacuum bellows 8 is provided around the carrier shaft 7. The seal 5 seals the carrier chamber 11 for the rotation of the rotary shaft 3. The carrier shaft 7 is fixed to the upper flange 8a by the bolts 12 and the O rings 9. The carrier shaft 7 and the vacuum bellows 8 seals the carrier chamber 11.

Figure 7:
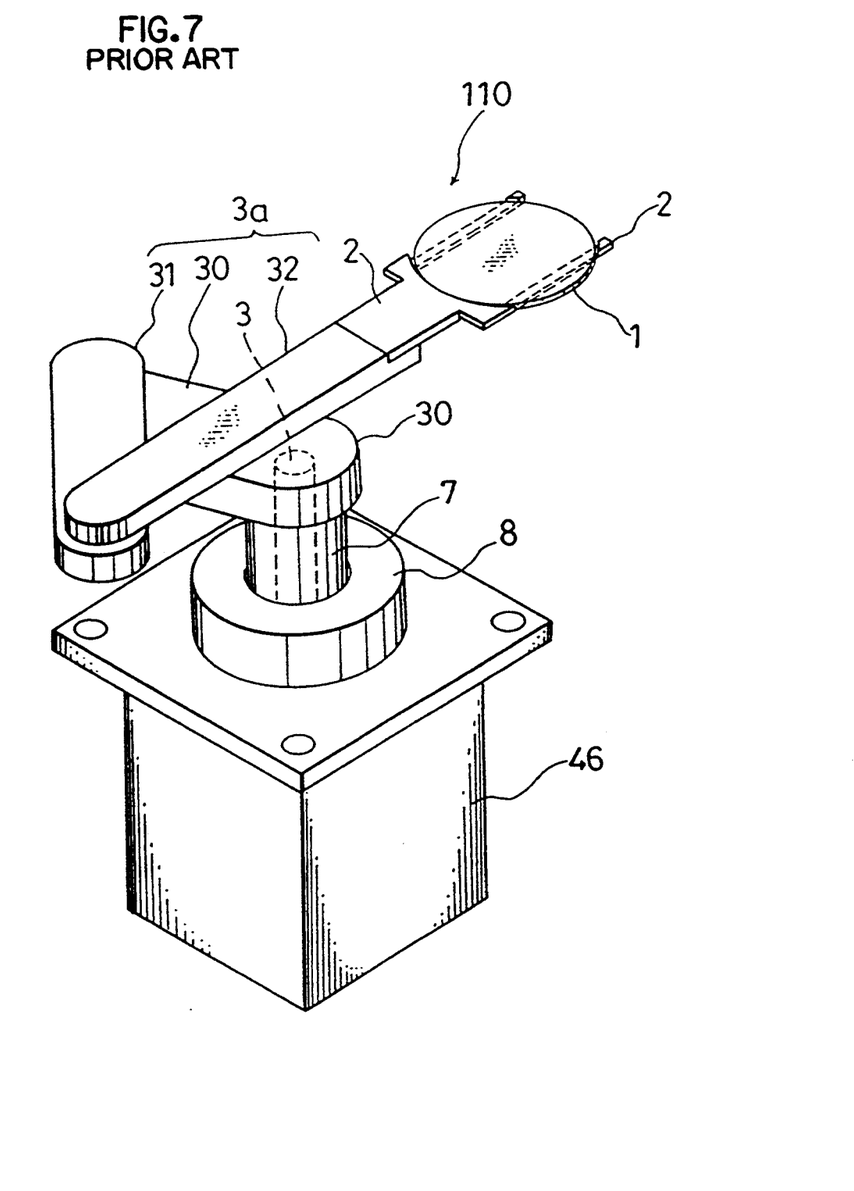
FIG. 7 is a perspective view showing an appearance of a semiconductor substrate carrying means.

Description is given of the arm member 3a hereinafter. FIG. 7 is a perspective view showing the semiconductor substrate carrying means 110 having the arm member 3a. The arm member 3a comprises a holder 2 on which the semiconductor substrate 1 is put, a rotary shaft 3, and a link mechanism constituted by first to third arms 30 to 32. When the rotary shaft 3 rotates, the first to third arms 30 to 32 are extended and retracted, whereby the semiconductor substrate 1 is carried from the spare chamber 61a to the respective reaction chambers 56a to 56d or from the respective reaction chambers 56a to 56d to the spare chamber 61a.

Description is given of the operation hereinafter. While the second and third gate shutters 62 and 41 are pushed up, the first gate shutter 65 is pulled down, whereby the spare chamber 61a is opened. The semiconductor substrate 1 is put on the delivery stage 60 in the spare chamber 61a by an appropriate means (not shown). Then, the first air cylinder 66 is operated to push up the first gate shutter 65, whereby the spare chamber 61a, the carrier chamber 11 and the reaction chamber 56d are respectively sealed. The respective chambers 61a, 11 and 56d which are sealed are evacuated to $1 \times 10^4$ Pa through the exhaust ports 68, 45, and 57, respectively.

Then, the second gate shutter 62 is pulled down to open the second and third gates 62a and 62b. Then, the semiconductor substrate 1 on the delivery stage 60 in the spare chamber 61a is carried into the carrier chamber 11 by the semiconductor substrate carrying means 110.

Figure 8A:
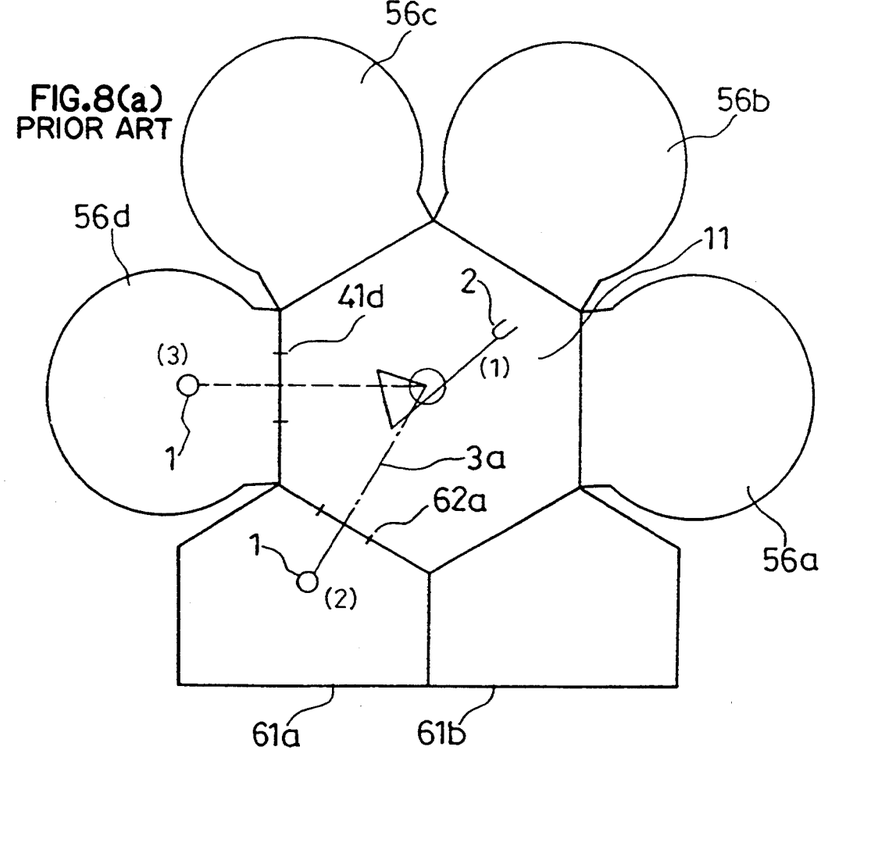
FIGS. 8(a) and 8(b) are a plan view and a perspective view for explaining the operation of the arm member.
Figure 8B:
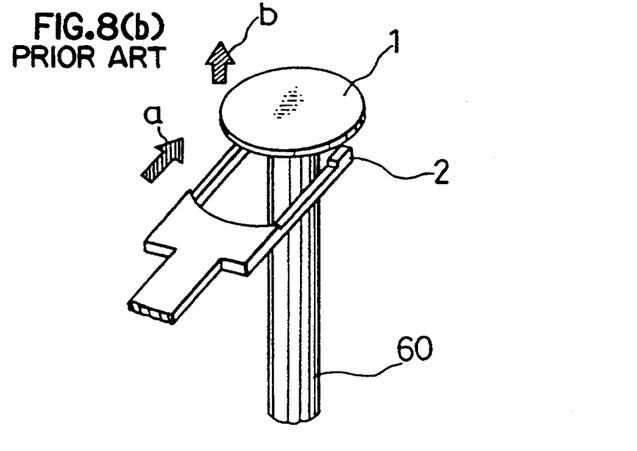

As shown in FIG. 8(a), the driving part 330 and the arm member 3a of the semiconductor substrate carrying means 110 are at standstill (refer to (1) in FIG. 8(a)), the rotary shaft 3 of the arm member 3a is rotated by an appropriate means (not shown) and then the first to third arms 30 to 32 are extended by the link mechanism (refer to (2) ). Then, as shown in FIG. 8(b), the holder 2 at the end of the arm member 3a advances beneath the semiconductor substrate 1 on the delivery stage 60 in the spare chamber 61a, that is, advances in a direction shown by arrow a. Then, the motor 34 of the driving part 330 is driven and the carrier shaft driving part 33 rises up. The semiconductor substrate 1 is picked up by the holder 2 in the direction shown by arrow b and then it is carried from the spare chamber 61a to the carrier chamber 11.

Thereafter the arm member 3a returns to the state in FIG. 8(a). At this time, the carrier shaft driving part 33 is in its raised position. Then, the gate shutter 62 is pushed to seal up the respective chambers 61a 11 and 56d, and then these chambers are evacuated to 100 Pa through the exhaust ports 68, 45, and 57, respectively.

In the state where the respective chambers 61a, 11 and 56d have the same pressure, the third gate shutter 41 is pulled down to open the fourth gate 41a and the fifth gate 41b. Then, the rotary shaft 3 of the arm member 3a is rotated by an appropriate means (not shown) similarly as described above and the arm member 3a is extended by the link mechanism (refer to (3) in FIG. 8(a)), whereby the semiconductor substrate 1 is carried to above the stage 50 in the reaction chamber 56d. Then, the carrier shaft driving part 33 is lowered to put the semiconductor substrate 1 on the stage 50. Then, the arm member 3a returns to the state (1) in FIG. 8(a). In this state, the third gate shutter 41 is pushed to seal up the respective chambers 61a, 11 and 56d and then these chambers are evacuated to 1 to 10 Pa through the exhaust ports 68, 45, and 57, respectively.

Thereafter, the semiconductor substrate 1 on the stage 50 in the reaction chamber 56d is heated to 300° to 500° C. by the heater 51, and the substrate 1 easily reacts with silane ($SiH_4$) used as a reactive gas. Diborane ($B_2H_2$) or phosphine ($PH_3$) is added to this reactive gas from the reactive gas inlet 55 and the reactive gas is blown upon the semiconductor substrate 1 at a pressure of 100 to 1000 Pa. Then, the holder 52 is slowly rotated at a speed of 1 to 10 rpm by an appropriate means (not shown) thereby to uniformly form a thin film of about 1 micron thickness on the semiconductor substrate 1. The gas is exhausted through the exhaust port 57.

In addition, the extension and retraction of the first to third arms 30 to 32 by the link mechanism of the arm member 3a and the rotation of the rotary shaft 3 of the arm member 3a while the semiconductor substrate 1 is carried from the spare chamber 61a to the respective reaction chambers 56a to 56d are well known and disclosed in, for example, Japanese published Utility Model Published Application No. 62-150087.

When the semiconductor substrate 1 whose surface is treated is carried from the reaction chamber 56d to the spare chamber 61b, the above-described operation is inversely carried out. That is, the respective chambers 61a, 11 and 56d transit to a complete vacuum state from a low vacuum state and then the semiconductor substrate is carried from the reaction chamber 56d to the carrier chamber 11. Then, the respective chambers 61a, 11 and 56d transit to atmospheric state from vacuum state and then the semiconductor substrate is carried from the carrier chamber 11 to the spare chamber 61a.

In addition, the above-described semiconductor substrate is a silicon substrate and the thin film formed thereon is a silicon oxidized film.

In the semiconductor device producing apparatus having the sealing mechanism constituted as described above, a difference in pressures between the vacuum carrier chamber 11 and the outside air is generated and a thrust of 300 Kg/cm² which pulls the carrier shaft into the carrier chamber is generated by the differential pressure. In this case, the power of the driving part for driving the carrier shaft vertically is equal to the sum of the weight of the carrier shaft and the above thrust. Then, the guide part for guiding the vertical movement is required to be strengthened and the whole apparatus is large in size due to the power of the driving part, resulting in a costly device.

SUMMARY OF THE INVENTION

It is an object of the present invention to provide a small-sized and inexpensive sealing mechanism for a semiconductor device producing apparatus, that can reduce or remove the thrust applied to the carrier shaft.

It is another object of the present invention to provide a method for producing a semiconductor device, using the above sealing mechanism.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, a semiconductor device producing apparatus includes a carrier chamber having an opening and capable of being vacuum sealed, a carrier member comprising a substrate holder, an arm member and means for carrying a substrate, which vertically reciprocates in the opening of the carrier chamber, and vacuum bellows which seal a space between the carrier chamber and the carrier member. The vacuum bellows comprises an upper bellows and a lower bellows provided with a hollow flange therebetween and the upper bellows is a double structure having an inner bellows and an outer bellows. An air inlet penetrates the hollow flange and air is introduced into a ring-shaped space between the inner bellows and the outer bellows through the air inlet. Therefore, thrust caused by the vacuum in the processing chamber and applied to the hollow flange is canceled by the pressure of the introduced air and then the thrust can be reduced or removed, whereby the load of the driving part can be relieved. As a result, a small-sized and inexpensive semiconductor device producing apparatus can be obtained.

According to a second aspect of the present invention, a method for producing a semiconductor device uses an apparatus including a carrier chamber having an opening and capable of being vacuum sealed, a carrier member comprising a substrate holder, an arm member and means for carrying the substrate, which vertically reciprocates in the opening of the carrier chamber and a sealing mechanism. This sealing mechanism is fixed to the carrier member and includes a flange having an air inlet, a first bellows and a second bellows. The first bellows is a double structure having an inner bellows and an outer bellows, and air is introduced into a ring-shaped space formed between the inner bellows and outer bellows through the air inlet of the flange. The second bellows seals the carrier-chamber. The production process is as follows. A spare chamber and the carrier chamber are made vacuous and the semiconductor substrate is carried from the spare chamber to the carrier chamber. Then, the carrier chamber and a reaction chamber are brought to a low vacuum and the semiconductor substrate is carried from the carrier chamber to the reaction chamber. The semiconductor substrate is treated in the reaction chamber. Thereafter, the reaction chamber and the carrier chamber are evacuated and the semiconductor substrate is carried from the reaction chamber to the carrier chamber. Then, the carrier chamber and the spare chamber are bought to atmospheric pressure and the semiconductor substrate is carried from the carrier chamber to the spare chamber. Therefore, the thrust can be reduced or removed and the load of the driving part can be relieved. As a result, a small-sized and inexpensive semiconductor device producing apparatus can be obtained.

DETAILED DESCRIPTION OF THE PREFERRED EMBODIMENTS

Figure 1:
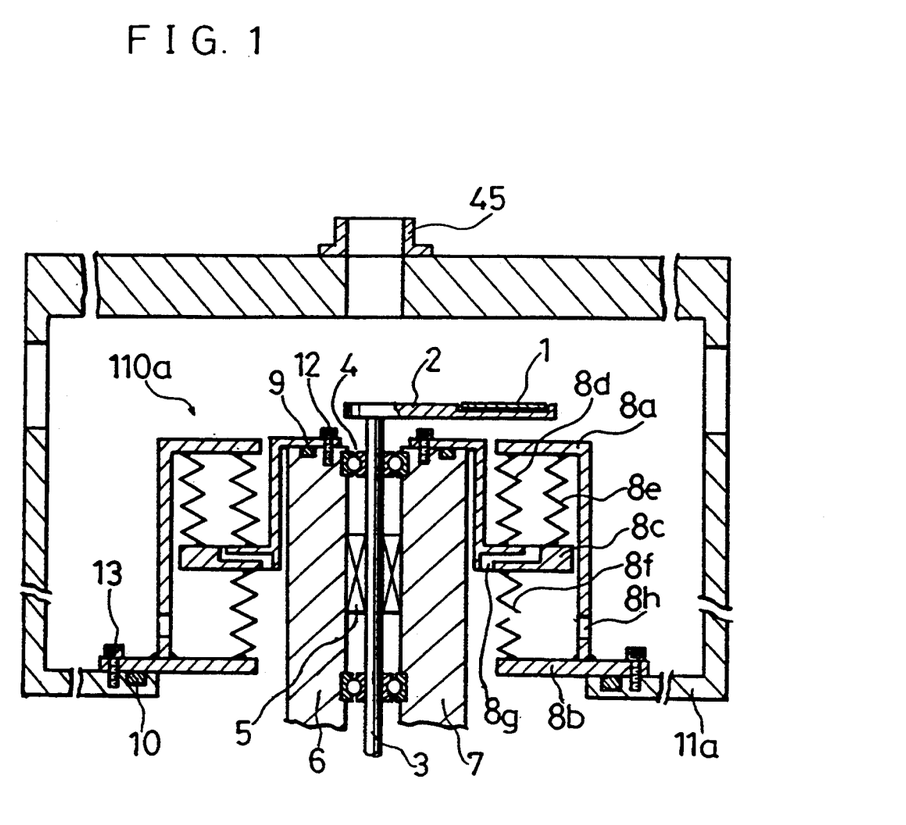
FIG. 1 is a cross-sectional view showing a structure of a carrier shaft of a semiconductor substrate carrying means in accordance with a first embodiment of the present invention.

Embodiments of the present invention will be described in detail with reference to the drawings. FIG. 1 is a cross-sectional view showing a structure of a carrier shaft of a semiconductor substrate carrying means using a sealing mechanism in a semiconductor thin film producing apparatus in accordance with a first embodiment of the present invention. In FIG. 1, the same reference numerals as those shown in FIG. 5 designate the same or corresponding parts.

A carrier chamber 11a has an opening at the center of its bottom and a semiconductor substrate carrying means 110a is provided at the opening via a lower flange 8b. The semiconductor substrate carrying means 110a comprises a case 46a including a driving part 330a which drives the carrier shaft 7 vertically, first to third vacuum bellows 8d to 8f which vacuum seal a space between the carrier shaft 7 and the carrier chamber 11a during the vertical movement of the carrier shaft 7, and an arm member 3a which carries the semiconductor substrate 1. The lower flange 8b is fixed to the edge of the opening of the carrier chamber 11 by the bolts 13 and O rings 10 thereby to keep the carrier chamber airtight. The appearance of the semiconductor substrate carrying means 110a is the same as that of the prior art shown in FIG. 7.

As shown in FIG. 1, the carrier shaft 7 surrounds the rotary shaft 3 of the arm member 3a via the bearing 4 and the seal 5. This seal 5 seals the carrier chamber 11a for the rotation of the rotary shaft 3. The carrier shaft 7 is fixed to the hollow flange 8c by the bolts 12 and O rings 9. Thus, the vacuum bellows and the carrier shaft 7 seal the carrier chamber 11a.

An upper flange 8a and a lower flange 8b are provided above and below the hollow flange 8c, respectively. A first inner bellows 8d and a second outer bellows 8e are provided between the hollow flange 8c and the upper flange 8a. A third bellows 8f is provided between the lower flange 8b and the hollow flange 8c. The ends of the third bellows 8f are airtightly welded to the hollow flange 8c and the lower flange 8b. The ends of the first inner bellows 8d and those of the second outer bellows 8e are airtightly welded to the upper flange 8a and the hollow flange 8c. In addition, the respective flanges 8a to 8c and the first to third bellows 8d to 8f are arranged around the rotary shaft 3.

An air inlet 8g through which air is introduced into a ring-shaped space formed by the first and second bellows 8d and 8e and the upper and hollow flanges 8a and 8c penetrates the hollow flange 8c. An exhaust port 8h for evacuating a ring-shaped space formed by the third bellows 8f and the upper, lower and hollow flanges 8a to 8c is provided at the lower side of the flange 8a.

Figure 3:
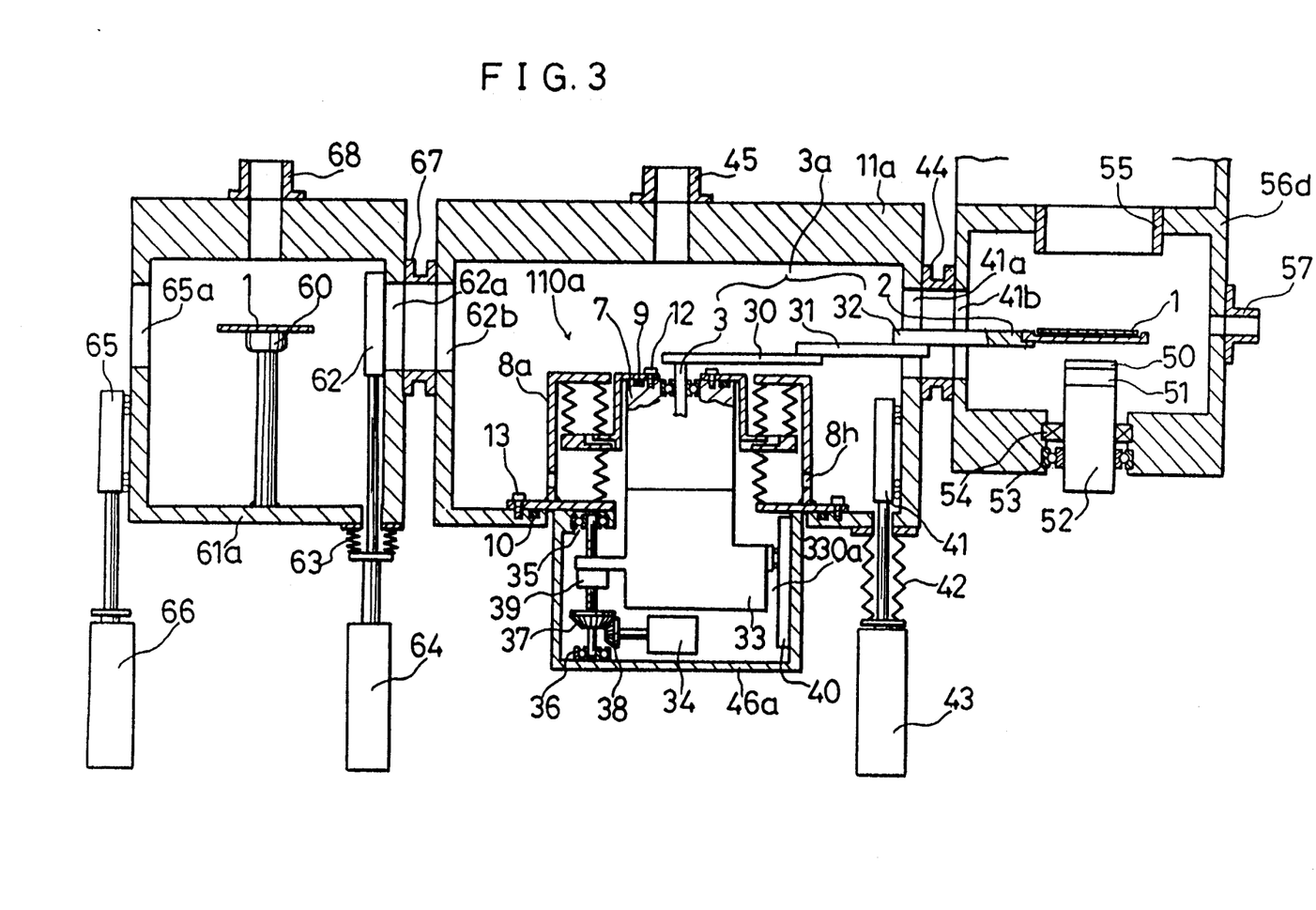
FIG. 3 is a cross-sectional view showing a structure of a semiconductor device producing apparatus in accordance with the first embodiment of the present invention.

The operation will be described hereinafter. Here, the operation for carrying the semiconductor substrate 1 from the spare chamber 61a shown in FIG. 3 to the reaction chamber 56d via the carrier chamber 11 or from the reaction chamber 56d to the spare chamber 61a via the carrier chamber 11a is the same as that of the prior art. Therefore, the description thereof will be omitted. Only the vertical operation of the carrier shaft 7 of the semiconductor substrate carrying means 110a will be described. When the carrier shaft 7 rises, the first and second bellows 8d and 8e contract while the third bellows expand and then the hollow flange 8c reaches the upper end of the upper flange 8a.

When the arm member 3a with the holder 2 on which the semiconductor substrate 1 is placed is moved to the stage 50 in the reaction chamber 56d and then the carrier shaft 7 is lowered, the first and second bellows 8d and 8e expand while the third bellows 8f contracts and the hollow flange 8c reaches the lower flange 8b.

In a case where the carrier shaft 7 vertically moves as described above, a thrust which pulls the carrier shaft 7 into the carrying chamber 11a is applied to the hollow flange 8c because of the vacuum carrier chamber 11a. This thrust is in proportion to the area of the circle inside the lower third bellows 8f. On the other hand, since air is introduced into the ring-shaped space formed by the first and second bellows 8d and 8e and the upper and hollow flanges 8a and 8c through the air inlet 8g, a force in a direction reverse to the above thrust is applied to the hollow flange 8c. This force is in proportion to the area of the ring-shaped space surrounded by the first and second bellows 8d and 8e. Accordingly, by making those two areas equal to each other, the mutual stresses are canceled in the hollow flange 8c, so that the hollow flange 8c of well balanced. While the thrust is 300 Kg/cm$^2$ in the prior art, can be reduced to 4 Kg/cm$^2$ or to negligible value in this first embodiment of the present invention.

In the above-described first embodiment, the vacuum bellows comprises the outer and inner bellows 8e and 8d and the single bellows 87 with the hollow flange 8c therebetween. In addition, air is introduced into the ring-shaped space between the inner and outer bellows from the air inlet 8g of the hollow flange 8c. Thus, the thrust applied to the carrier shaft 7 is negligible, whereby the semiconductor substrate carrying means 110a can be minimized and an inexpensive semiconductor device producing apparatus can be obtained.

In addition, the semiconductor device producing apparatus includes the carrier chamber 11a having an opening capable of being vacuum sealed, the carrier shaft 7 comprising the holder 2, the arm member 3a and means for carrying the substrate 1, which vertically reciprocates in the opening of the carrier chamber 11a, and the sealing mechanism. This sealing mechanism is fixed to the carrier shaft 7 and includes the hollow flange 8c having an air inlet 8g, the first and second bellows 8d and 8c, and the third bellows 8f. A ring-shaped space is formed between the first and second bellows 8d and 8c and air is introduced into this space through the air inlet 8g of the hollow flange 8c. The third bellows 8f seals the carrier chamber 11a. Using this apparatus, the semiconductor substrate 1 is processed as follows. The spare chamber and the carrier chamber are evacuated and the semiconductor substrate is carried from the spare chamber to the carrier chamber. Then, the carrier chamber and the reaction chamber are evacuate to allow vacuum and the semiconductor substrate is carried from the carrier chamber to the reaction chamber. The semiconductor substrate is treated in the reaction chamber. Thereafter, the reaction chamber and the carrier chamber are evacuate and the semiconductor substrate is carried from the reaction chamber to the carrier chamber. Then, the carrier chamber and the spare chamber are brought to atmospheric pressure and the semiconductor substrate is carried from the carrier chamber to the spare chamber. Therefore, the thrust can be reduced or removed and the load on the driving part 330a can be relieved. As a result, a small-sized and inexpensive semiconductor device producing apparatus can be obtained.

In the above-described first embodiment, the sealing mechanism of the present invention is applied to the semiconductor substrate carrying means 110a in the carrier chamber 11a in the semiconductor device producing apparatus in which the arm member 3a in the carrier chamber 11a vertically moves while the delivery stage 60 in the spare chamber 61a and the stage 50 in the reaction chamber 56d are fixed. However, the sealing mechanism of the present invention can be also applied to the semiconductor device producing apparatus in which the arm member 3a in the carrier chamber 11a is fixed while the delivery stage 60 in the spare chamber 61a and the stage 50 in the reaction chamber 56d vertically move. In addition, the sealing mechanism of the present invention can also be applied to the delivery stage 60 and the stage 50 which vertically move.

Figure 2:
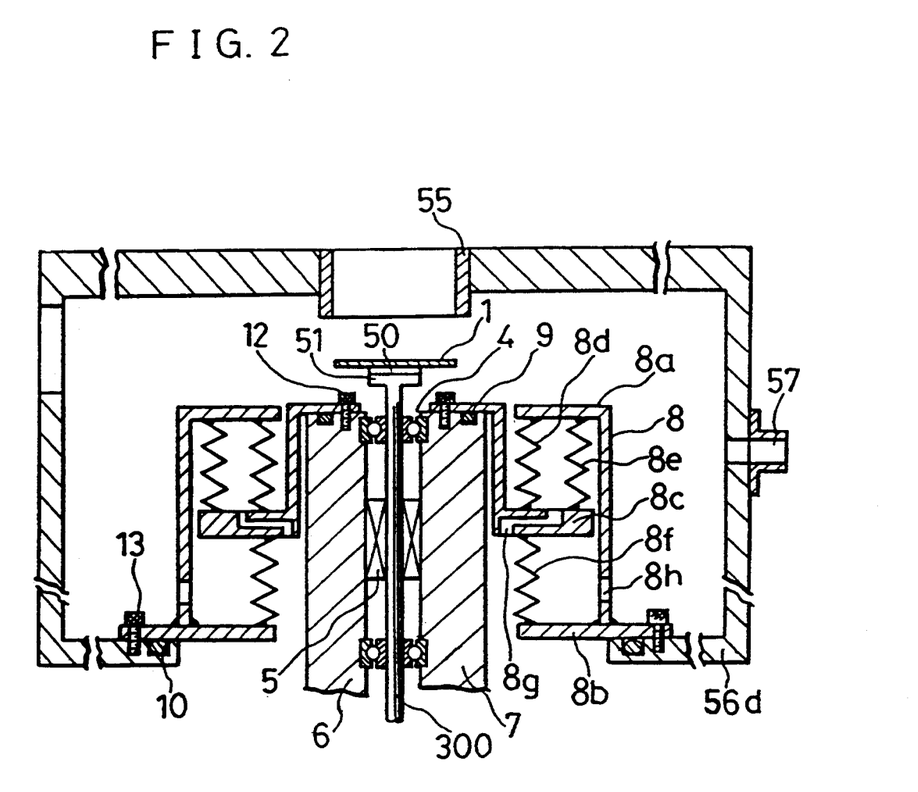
FIG. 2 is a cross-sectional view showing a structure of a vacuum reaction chamber of a semiconductor device producing apparatus in accordance with a second embodiment of the present invention.

Description is given of a second embodiment of the present invention. FIG. 2 is a cross-sectional view showing a structure of the reaction chamber 56d of the semiconductor device producing apparatus, in which the stage 50 vertically moves, in accordance with the second embodiment of the present invention. In FIG. 2, the stage 50 includes a heater 51 and a rotary shaft 300 and a carrier shaft 7 is provided around the rotary shaft 300. The carrier shaft 7 is fixed to the hollow flange 8c and the upper flange 8a and the lower flange 8b are provided above and below the hollow flange 8c, respectively. A first inner bellows 8d and a second outer bellows 8e are provided between the upper flange 8a and the hollow flange 8c and a third bellows 8f is provided between the lower flange 8b and the hollow flange 8c.

An air inlet 8g is provided in the hollow flange 8c and air is introduced into the ring-shaped space between the first and second bellows 8d and 8e through the inlet 8g, whereby the thrust applied to the hollow flange 8c because of the vacuum in reaction chamber 56d is canceled.

It is supposed that the spare chamber (61a in FIG. 3) of the semiconductor device producing apparatus in accordance with this second embodiment has a delivery stage (60 in FIG. 3) which vertically moves and the delivery stage is fitted with the same sealing mechanism as that in the reaction chamber 56d in FIG. 2.

The operation of this second embodiment will be described. The arm member (3a in FIG. 3) in the carrier chamber (11a in FIG. 3) moves above the delivery stage (60 in FIG. 3) in the spare chamber (61a in FIG. 3) and the semiconductor substrate 1 on the delivery stage is picked up by the holder 2. Then, the delivery stage is lowered and the semiconductor substrate 1 is carried into the reaction chamber 56d by the arm member (3a in FIG. 3) in the carrier chamber (11a in FIG. 3). Then, the stage 50 in the reaction chamber 56d rises and the semiconductor substrate 1 is put on the stage 50.

In the above second embodiment, the sealing mechanism of the present invention is applied to the semiconductor device producing apparatus in which the arm member 3a in the carrier chamber 11a is fixed while the delivery stage 60 in the spare chamber 61a and the stage 50 in the reaction chamber 56d vertically move. Also in this case, the same effects as described above can be obtained.

As is evident from the foregoing description, according to the present invention, a semiconductor device producing apparatus includes a processing chamber having an opening capable of being vacuum sealed, a carrier member comprising a substrate holder, an arm member and means for carrying the substrate, which vertically reciprocates in the opening of the processing chamber, and vacuum bellows which seal a space between the processing chamber and the carrier member. The vacuum bellows comprises an upper bellows and a lower bellows provided with a hollow flange therebetween the upper bellows is a double structure having an inner bellows and an Outer bellows. An air inlet penetrates the hollow flange and air is introduced through this air inlet into a ring-shaped space between the inner bellows and the outer bellows. Therefore, thrust caused by the vacuum in the processing chamber and applied to the hollow flange is canceled by the pressure of the introduced air and then the thrust can be reduced or removed, whereby the load of the driving part can be relieved. As a result, a small-sized and inexpensive semiconductor device producing apparatus can be obtained.

A method for producing a semiconductor device in accordance with the present invention uses an apparatus including a carrier chamber having an opening and capable of being vacuum sealed, a carrier member comprising a substrate holder, an arm member and means for carrying the substrate which vertically reciprocates in the opening of the carrier chamber, and a sealing mechanism. This sealing mechanism is fixed to the carrier member and includes a flange having an air inlet, a first bellows and a second bellows. The first bellows is a double structure having an inner bellows and an outer bellows, and air is introduced into a ring-shaped space between the inner and outer bellows through the air inlet of the flange. The second bellows seals the carrier chamber. The production process is as follows. A spare chamber and the carrier chamber are evacuated and the semiconductor substrate is carried from the spare chamber to the carrier chamber. Then, the carrier chamber and a reaction chamber are brought to a low vacuum and the semiconductor substrate is carried from the carrier chamber to the reaction chamber. The semiconductor substrate is treated in the reaction chamber. Thereafter, the reaction chamber and the carrier chamber are evacuated and the semiconductor substrate is carried from the reaction chamber to the carrier chamber. Then, the carrier chamber and the spare chamber are made brought to atmospheric pressure and the semiconductor substrate is carried from the carrier chamber to the spare chamber. Therefore, the thrust can be reduced or removed and the load of the driving part can be relieved. As a result, a small-sized and inexpensive semiconductor device producing apparatus can be obtained.

What is claimed is:

1. A method for producing a semiconductor device using an apparatus comprising:
   a spare chamber;
   a reaction chamber;
   a carrier chamber having an opening and capable of being vacuum sealed;
   a carrier member comprising a substrate holder, an arm member, and means for carrying a substrate which vertically reciprocates in the opening of said carrier chamber; and
   a sealing mechanism fixed to said carrier member and including a flange having opposed first and second surfaces and an air inlet, an inner bellows and an outer bellows attached to the first surface of said flange and to said carrier member and forming a ring-shaped space between them, the air inlet opening into the ring-shaped space, and a second bellows attached to the second surface of said flange and said carrier chamber;
   said production method comprising:
   evacuating said spare chamber and said carrier chamber and carrying a semiconductor substrate from said spare chamber to said carrier chamber;
   evacuating said carrier chamber and said reaction chamber to a low vacuum and carrying said semiconductor substrate from said carrier chamber to said reaction chamber;
   treating said semiconductor substrate in said reaction chamber;
   evacuating said reaction chamber and said carrier chamber and carrying said semiconductor substrate from said reaction chamber to said carrier chamber; and
   bringing said carrier chamber and said spare chamber to atmospheric pressure and carrying said semiconductor substrate from said carrier chamber to said spare chamber.

2. A method for producing a semiconductor device using an apparatus comprising:
   a carrier chamber;
   a reaction chamber;
   a spare chamber having an opening and capable of being vacuum sealed;
   a supporting member having a stage for supporting a semiconductor substrate;
   a vertically reciprocating part surrounding said supporting member which vertically reciprocates in the opening o said spare chamber; and
   a sealing mechanism fixed to said vertically reciprocating part and including a flange having opposed first and second surfaces and an air inlet, an inner bellows and an outer bellows attached to the first surface of said flange and to said spare chamber and forming a ring-shaped space between them, opening into the ring-shaped space, and a second bellows attached to the second surface of said flange and said spare chamber;
   said production method comprising:
   evacuating said spare chamber and said carrier chamber and carrying a semiconductor substrate from said spare chamber to said carrier chamber;
   evacuating said carrier chamber and said reaction chamber to a low vacuum and carrying said semiconductor substrate from said carrier chamber to said reaction chamber;
   treating said semiconductor substrate in said reaction chamber;
   evacuating said reaction chamber and said carrier chamber and carrying said semiconductor substrate from said reaction chamber to said carrier chamber; and
   bringing said carrier chamber and said spare chamber to atmospheric pressure and carrying said semiconductor substrate from said carrier chamber to said spare chamber.

3. The method for producing a semiconductor device in accordance with claim 2 including evacuating said spare chamber to $1 \times 10^4$ Pa, said carrier chamber to 100 Pa, and said reaction chamber to 1 to 10 Pa.

4. The method for producing a semiconductor device in accordance with claim 2 wherein said semiconductor substrate is a silicon substrate.

5. The method for producing a semiconductor device in accordance with claim 2 including heating said semiconductor substrate to 300° C. to 500° C. with a heating means in said reaction chamber to react with a reactive gas to form a thin film on said substrate.

6. The method for producing a semiconductor device in accordance with claim 5 including reacting said substrate with silane ($SiH_4$) and one of diborane ($B_2H_2$) and phosphine ($PH_3$).

7. The method for producing a semiconductor device in accordance with claim 5 including forming a thin film of silicon dioxide on said semiconductor substrate.

8. A method for producing a semiconductor device using an apparatus comprising:

a carrier chamber;

a spare chamber;

a reaction chamber having an opening and capable of being vacuum sealed;

a supporting member having a stage for supporting a semiconductor substrate, heating means, and rotation means;

a reaction gas inlet through which reaction gas for treating a substrate is introduced into said reaction chamber;

a vertically reciprocating part surrounding said supporting member which vertically reciprocates in the opening of said reaction chamber; and a sealing mechanism fixed to said vertically reciprocating part and including a flange having opposed first and second surfaces and an air inlet, an inner bellows and an outer bellows attached to the first surface of said flange and to said spare chamber and forming a ring-shaped space between them, opening into the ring-shaped space, and a second bellows attached to the second surface of said flange and said spare chamber;

said production method comprising:

evacuating said spare chamber and said carrier chamber and carrying a semiconductor substrate from said spare chamber to said carrier chamber;

evacuating said carrier chamber and said reaction chamber to a low vacuum and carrying said semiconductor substrate from sad carrier chamber to said reaction chamber;

treating said semiconductor substrate in said reaction chamber;

evacuating said reaction chamber and said carrier chamber and carrying said semiconductor substrate from said reaction chamber to said carrier chamber; and bringing said carrier chamber and said spare chamber to atmospheric pressure and carrying said semiconductor substrate from said carrier chamber to said spare chamber.

* * * * *

UNITED STATES PATENT AND TRADEMARK OFFICE
CERTIFICATE OF CORRECTION

PATENT NO. : 5,346,513

DATED : September 13, 1994

INVENTOR(S) : Taniguchi et al.

It is certified that error appears in the above-indentified patent and that said Letters Patent is hereby corrected as shown below:

Column 10, line 28, change "o" to --of--;

Column 10, line 34, after "," insert --the air inlet--;

Column 12, line 3, after "," insert --the air inlet--;

Column 12, line 14, change "sad" to --said--.

Signed and Sealed this

Seventeenth Day of January, 1995

Attest:

BRUCE LEHMAN

Attesting Officer     Commissioner of Patents and Trademarks